(12) United States Patent
Tomesen et al.

(10) Patent No.: US 6,282,249 B1
(45) Date of Patent: Aug. 28, 2001

(54) SATELLITE RECEIVER

(75) Inventors: M. T. Tomesen, Venlo; Leo J. M. Ruitenburg, Swalmen, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/011,490

(22) PCT Filed: Jun. 18, 1997

(86) PCT No.: PCT/IB97/00736

§ 371 Date: Feb. 11, 1998

§ 102(e) Date: Feb. 11, 1998

(87) PCT Pub. No.: WO97/50187

PCT Pub. Date: Dec. 31, 1997

(30) Foreign Application Priority Data

Jun. 27, 1996 (EP) .................................................. 96110361

(51) Int. Cl.$^7$ ....................................................... H03D 3/18
(52) U.S. Cl. .......................... 375/327; 375/329; 375/344; 329/307
(58) Field of Search .................................... 375/375, 261, 375/332, 326, 329, 327, 376, 344; 329/304, 307

(56) References Cited

U.S. PATENT DOCUMENTS

| | | | | |
|---|---|---|---|---|
| 4,355,404 | * | 10/1982 | Uzunoglu | 375/332 |
| 4,961,206 | * | 10/1990 | Tomlinson et al. | 375/261 |
| 5,150,384 | * | 9/1992 | Cahill | 375/375 |

* cited by examiner

*Primary Examiner*—Don N. Vo

(57) ABSTRACT

Proposed is a switchable loop filter structure which allows a dual mode operation. A low bandwidth mode is used during acquisition of a channel. In case of high rate reception the low bandwidth synthesizer loop is combined with a high bandwidth carrier recovery loop. This combination allows steps of the synthesizer which are tracked in the carrier recovery loop. The tuner steps are used to compensate input signals frequency drift. An algorithm is proposed which allows acquisition in a low synthesizer loop bandwidth mode and switching to a high bandwidth synthesizer loop mode while maintaining frequency lock. This allows the use of a high bandwidth synthesizer loop and a low bandwidth carrier recovery loop. This combination is best for reception of low rate input signals. The synthesizer loop compensates for residual FM of the tuner Local Oscillator.

3 Claims, 6 Drawing Sheets

480MHz

480MHz

480MHz

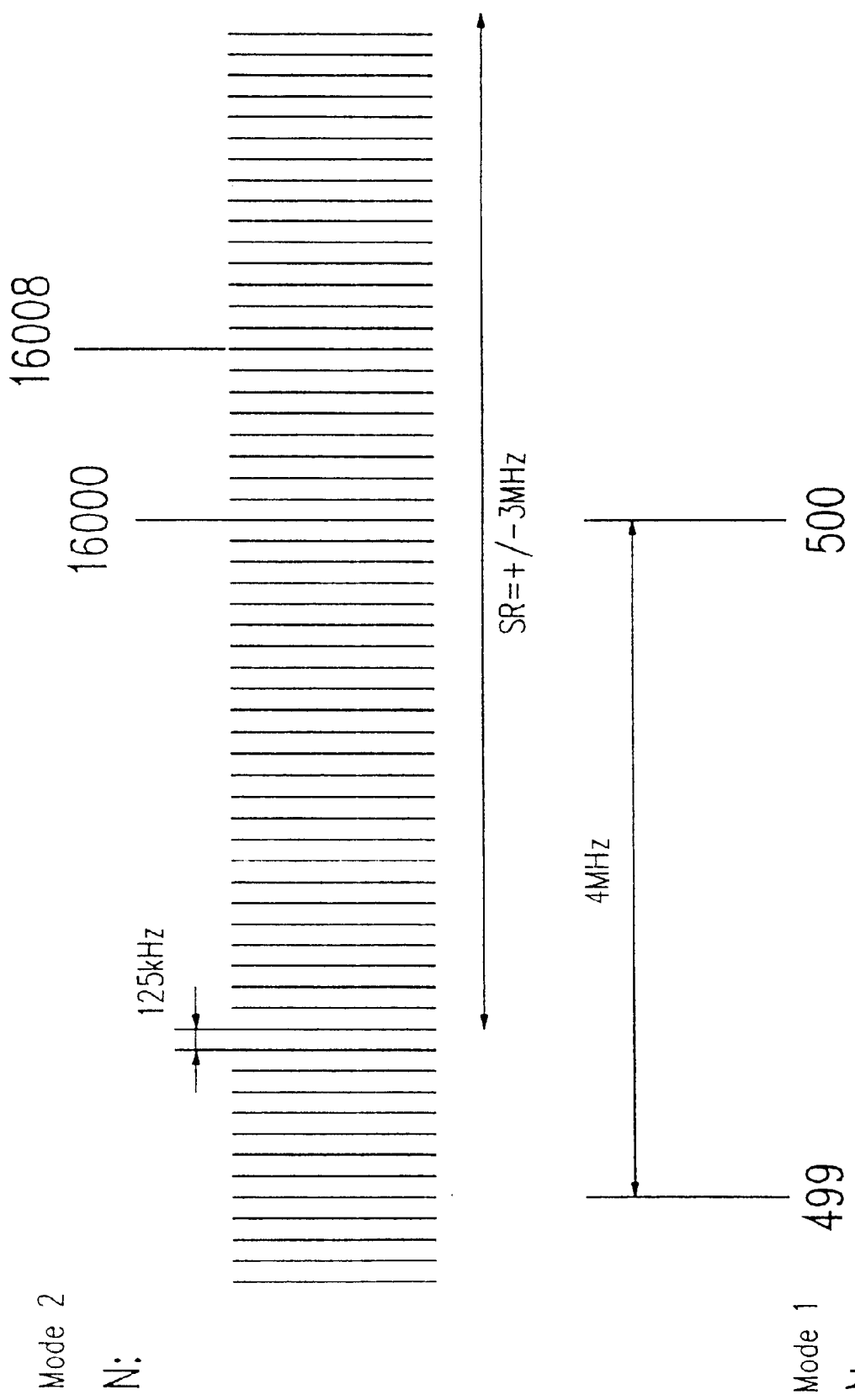

SATELLITE RECEIVER

The present invention relates to satellite receivers according to the preamble of claim 1.

Introduction: Variable Rate Digital Signals From Satellite

Figure 1:
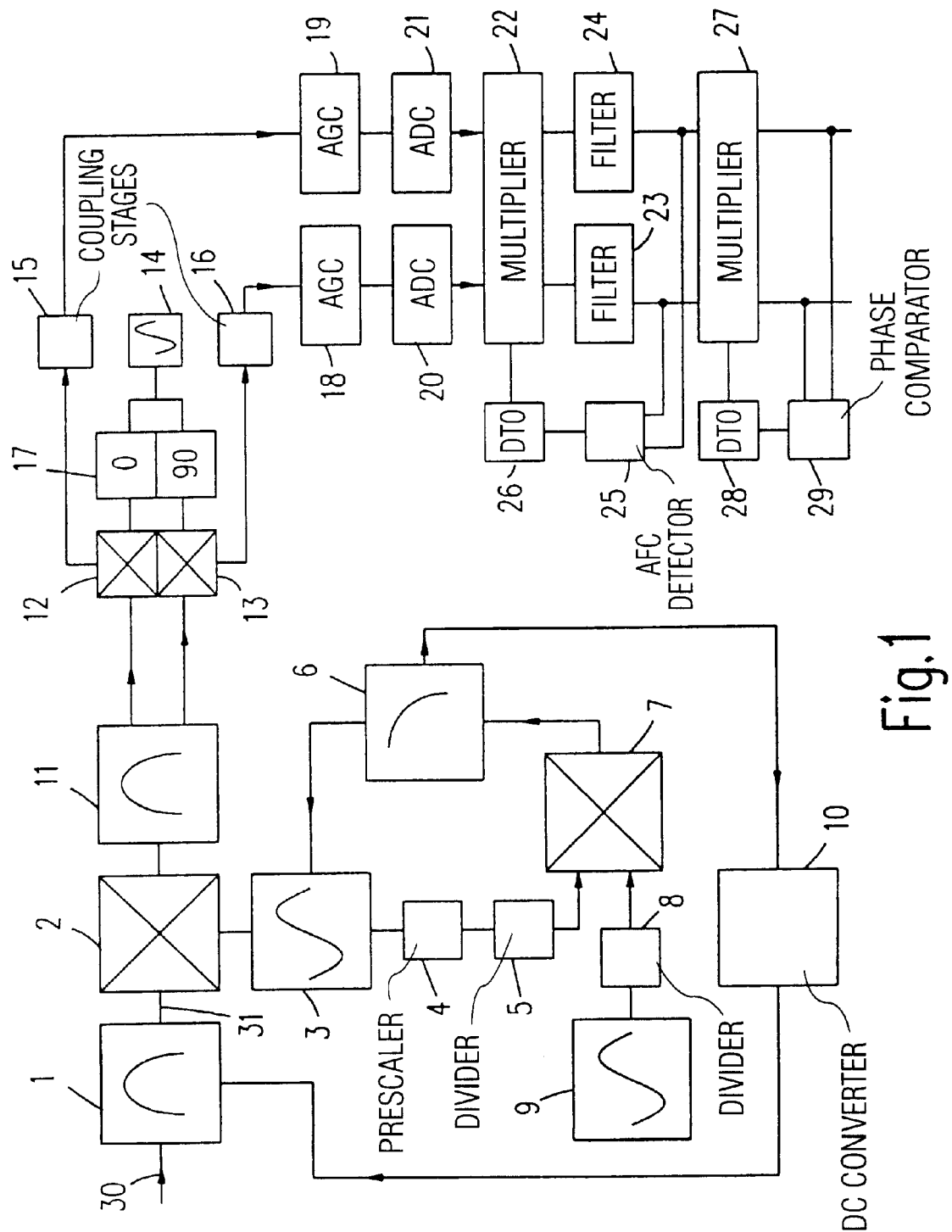

FIG. 1 shows a receiver concept for variable rate digital signals over satellite as implemented in the integrated circuit of the type TDA 8043 of Philips Semiconductors. An L-band input signal is received from a Low Noise Block converter outdoor unit, hereafter named as LNB, and fed into an input terminal of a tracking filter indicated by a reference numeral 1. This L-band input signal represents a frequency multiplex of QPSK modulated carriers in a typical frequency range from 950–2150 MHz. Transponders may carry multiple QPSK modulated carriers in frequency multiplex, called single channel per carrier (SCPC) application, or a single high bit rate modulated carrier. As described in a more detailed manner in the publication "pr ETS 300 421" of August 1994 concerning "Digital broadcasting systems for television, sound and data services—framing stucture, channel coding and modulation for 11/12 GHz satellite services", the high bit rate modulated carriers carry the MPEG2 transport stream of a number of time multiplexed channels. Also the simulcast combination of an analog FM modulated signal and an SCPC channel is possible. FIG. 2 shows examples for possible receiver input signals. A wide range in symbol rates is desired to be received by the same receiver. A common used coding and modulation scheme is described in the Digital Video Broadcast standard, hereafter named as DVB and described in more detail in the above-mentioned publication "pr ETS 300 421".

Description of a State of the Art Receiver Concept
Frequency Synthesizer Loop The input signal is mixed down to a fixed Intermediate Frequency, hereinafter named as IF and having a typical value of 479.5 MHz, by means of a tunable Local Oscillator (LO), which is typically performed by a voltage controlled oscillator, hereinafter named as VCO, and placed at a frequency equal to the selected input carrier frequency plus the IF value. This LO is locked to a reference frequency in a Phase Locked Loop (PLL). Reference frequencies are usually generated in crystal type oscillators operated at a frequency between 4 and 20 MHz. A frequency divider ratio N of a programmable divider with the reference numeral 5 in FIG. 1 is programmed for obtaining the desired VCO frequency. A divider ratio M of another frequency divider 8 in FIG. 1 determines the frequency at the input ports of a phase detector 7 in FIG. 1, hereinafter named as comparison frequency. The divider ratio M of the frequency divider 8 and a divider ratio P of a prescaler 4 inserted before the programmable divider 5 can be either fixed or programmable. In all known receivers, the comparison frequency and loop parameter settings are chosen fixed, independent of the symbol rate of the selected modulated carrier. The described function (programmable comparison frequency) can be realised using e.g. an SP5659 frequency synthesizer provided by GEC Plessey semiconductors.

Receiver Filtering

FIG. 1 comprises an IF filter 11 which is a fixed bandwidth IF filter, usually of Surface Acoustic Wave (SAW) type. The bandwidth must be high enough to pass the signal spectrum when the highest specified symbol rate of the QPSK modulated carrier is to be received. When the variable rate decoder receives a lower symbol rate of an SCPC carrier in frequency division multiplex, hereinafter named as FDM, the same IF filter bandwidth is used. A more expensive solution uses a switchable IF filter with a low bandwidth filter used when receiving an L-band signal modulated with an information signal at a low symbol rate.

The non-desired adjacent channels are suppressed in filters with the reference numerals 23 and 24 in FIG. 1. These are variable rate Nyquist filters, which can be programmed to match the incoming symbol rate. The channel filter selectivity function of the Nyquist filters 23 and 24 is allowed to be postponed to this late stage in the receiver, provided that all preceding stages have sufficient dynamic range to pass the signal which carries unwanted as well. This requirement also includes sufficient available bits in analog digital converters (ADC) with the reference numerals 20 and 21 in FIG. 1.

Carrier Recovery

Demodulation of the QPSK signal requires the use of a synchronous carrier. This carrier is extracted from the input signal in a local phase locked loop. The phase and frequency detector functions needed for this local phase locked loop are implemented in the digital domain. Here signal samples are compared with look-up table values for generating the frequency and phase correction signal for the coherent carrier. The local phase locked loop can be realised fully in the digital domain using a discrete time oscillator, hereinafter named as DTO, and a complex multiplier. This is depicted in FIG. 1 where reference numeral 27 denotes a complex multiplier, reference numeral 28 denotes a DTO and reference numeral 29 denotes a phase comparator, all working in the digital domain, that is with a stream of digital values building up the signal instead of an analog signal. The loop can also be closed over an analog VCO with the reference numeral 14 in FIG. 1 and a quadrature mixer consisting of two mixer stages with the reference numerals 12 and 13. This last option is not depicted in FIG. 1.

Under given phase noise and input white noise conditions, the curve of the phase jitter of the recovered carrier versus the natural carrier recovery PLL loop bandwidth will exhibit an optimum. For a chosen white noise and phase noise combination, the optimum loop bandwidth value shifts to lower values with lower rates. Not only the optimum shifts, but the resulting phase jitter in the loop will increase as well. Therefore lower phase noise values are required at low rates when the input signal to noise is kept the same.

Secondly, the loop stability has important implications. Since the digitally implemented phase detector will exhibit a delay proportional to the symbol time, the maximum allowable loop bandwidth has the lowest value for low symbol rate reception again.

Carrier Acquisition

For acquisition of a modulated carrier, a bus controlled algorithm is started. After receiving the frequency set point, a synthesizer sweep is started. Tuner steps are performed in a defined frequency window. The window is chosen such that the frequency error in the signal coming from the LNB can be detected. After a tuner step, the receiver status is checked for detection of signal presence. Usually receiver clock recovery lock is taken, since only a small fraction of the signal has to be received for already obtaining this lock.

The grid of the frequency sweep is determined by the acquisition range of the signal presence detector. Usually only a detector is available after the Nyquist filter. The bandwidth of the detector therefore scales with the received symbol rate, and the acquisition range will be approximately equal to plus and minus the symbol frequency divided by 6. This leads to the conclusion that a fine tuner step grid is necessary when low symbol rates are to be received.

When the input frequency deviates from the nominal value due to LNB ageing or temperature drift, the frequency difference must be compensated by a frequency shift in the VCO following the SAW filter. In case of high bit rate reception, the SAW filter must be wide enough to pass the signal without a single sided cut of the signal due to the displacement from the nominal center frequency value.

In U.S. Pat. No. 5,452,327 a programmable randomly tunable digital demodulator is provided with a carrier recovery loop and a PN code clock recovery loop each having a programmable digital loop filter coupled in series therein. Each digital loop filter is controlled by a timing control which is capable of controlling the carrier frequency tuning and the PN tuning frequency under the control of a microprocessor. A replica PN generator is programmed to produce an epoch signal when the transmitted carrier frequency and/or chipping rate is varied in a pseudorandom manner and is coupled to the timing controls so that the modulator replicates the received variable rate signals.

U.S. Pat. No. 4,117,420 shows a phase-locked loop having a controllable oscillator and a phase detector for generating an output signal which is applied as control signal to the oscillator through a loop filter comprising a storage element, which loop filter is switchable under the control of a control circuit between a first state wherein the loop filter has a wide passband and a second state wherein the loop filter has a narrow passband, provided with an arrangement connected to said storage element for determining the instants at which the instantaneous value of the signal stored in the storage element is equal to the average value of the control signal for the oscillator, the control circuit being arranged such that, after locking, switching-over of the loop filter from the first to the second state is done at one of the instants determined by said arrangement.

From WO 88/06383 A1 a phase lock loop for use in carrier acquisition is known employing a predetection filter and a loop filter switchable between a constant phase margin and second order characteristic. In the acquisition mode, the constant phase margin characteristic is employed to acquire the carrier and the second order characteristic is thereafter employed to track the carrier. To avoid loss of lock when switching from the acquisition to the track mode, the second order characteristic retains only the pole at the origin and the lowest frequency zero of the constant phase margin characteristic. The loop filter parameters are selected to minimize the mean square deviation of a phase margin expression which includes contributions from the predetection filter pole and from positive poles generated by the loop's voltage controlled oscillator.

Shortcomings of the State of the Art

A main problem in the described receiver is the low carrier recovery loop bandwidth at low symbol rates. For stability (loop delay) and for low phase jitter a small bandwidth is necessary.

The low bandwidth loop allows very little residual frequency modulation of the LO e.g. by microphony. This means that the LO will become susceptible for microphony and crackle disturbances in the tuner housing. The effect is critical due to the extreme ratio of VCO efficiency (10–150 MHz/V) and the loop bandwidth (5–30 kHz). When the residual FM is not suppressed sufficiently, cycle slips may occur in the carrier in the carrier recovery loop which in turn leads to loss of information.

It is desirable to combine signal reception of information signals with a high as well as a low bandwidth respectively bit rate. However, a variety of problems will arise in combining this signal receptions. Especially combining high and low bit rate QPSK causes the shortcomings listed beneath, as a combination of high and low bit rate QPSK solutions in one receiver concept must be based on compromises for conflicting requirements:

High bit rate needs a wide bandwidth IF filter, while low bit rate needs significantly less. If for cost reasons only one IF filter is used, the additional digital nyquist filtering has, especially for the low bit rate, to realize the unwanted channel suppression of adjacent channels as well. The ADC preceding the digital filter needs to have sufficient resolution to avoid bit errors in the decoder.

The single IF filter needs to be wide enough for the high bit-rate, but as narrow as possible for the low bit rate application. For high bit rate QPSK the tuning accuracy, the temperature of the filter, tolerances in filter specification, etc. will determine the minimum bandwidth needed. For low bit rate reception, the resolution of the ADC determines the number of adjacent channels, which are allowed to pass the IF filter and to reach the ADC input. So the maximum IF bandwidth follows in relation with a condition for the ADC resolution.

Low bit rate QPSK requires wide loop bandwidth for tuner PLL, to reduce sensitivity of the receiver for unwanted phase modulation of the tuner oscillator due to e.g. microphony. To achieve this wide loop bandwidth, the reference frequency of the (conventional) PLL synthesizer has to be rather high, which increases the minimum step width of the synthesizer as might be needed for AFC. As a synthesizer with fractional N divider can make smaller steps than the internal reference frequency, reduction of phase-jitter in this concept needs special sophisticated measures. Consequently, this solution would mean a dedicated synthesizer with corresponding higher costs than for the traditional PLL.

High bit rate QPSK is less sensitive for microphony, but needs to be tuned accurately within the IF filter. An automatic frequency control, hereinafter named as AFC, might be needed here, which excludes the possibility of a big minimum step width. The reference frequency has to be chosen smaller, to allow smaller frequency steps (which means a smaller step width) with automatically the consequence of a lower bandwidth for the loop filter.

Especially the last two points show the conflicting elements for the combination of low and high bit rate QPSK in one receiver.

It is therefore an object of the present invention to provide a satellite receiver that overcomes the shortcomings of satellite receivers as described above.

Especially it is an object of the present invention to provide a satellite receiver that is stable in operation and has a low noise figure regardless whether in use with high or low bandwidth respectively bit rate information signals.

It is a general object of the present invention to provide a satellite receiver that is small in size and weight and of low manufacturing effort and costs and reliable in operation.

According to these and other objects of the invention, there is provided a satellite receiver as given by the preamble of claim 1, characterized by the characteristics as given in the characterizing part of claim 1.

Favourable arrangements and embodiments of the present invention are provided by the characteristics as given in the dependent claims.

The invention advantageously proposes the use of a switchable synthesizer loop filter. This allows a dual mode operation. The operation modes are characterized by:

Mode 1
  High comparison frequency
  Big tuner steps
  High synthesizer loop bandwidth
  Used as in-lock mode for low rate reception Mode 2
  Low comparison frequency
  Small tuner steps
  Low synthesizer loop bandwidth
  Used as acquisition mode for any rate and in-lock mode for high rate reception only Mode 1 is used for low rate reception. The choice of high comparison frequency (typically 2 MHz) allows the use of a high bandwidth (typically 15 kHz) of the loop filter of the PLL. The high reference frequency reduces the phase noise floor of the synthesizer itself, which is the dominating contribution to the carrier phase noise for frequencies near to the carrier frequency within the loop bandwidth. The high PLL loop bandwidth suppresses residual frequency modulation (FM) of the LO. The high comparison frequency automatically results in a wide tuner step grid (larger step width of the synthesizer), since the tuner step width is proportionally to the comparison frequency. This grid will be too wide for acquisition of low bit rate modulated carriers in a fine pitch of the FDM comb. Therefore an acquisition mode is necessary. As an example, with an acquisition range equal to plus and minus the symbol rate divided by 6 and a tuner step width of 4 MHz, the maximum symbol rate for reliable acquisition is 12 Msym/s. For lower bit rates the tuner step width must be smaller (this characterizes the acquisition mode).

For acquisition, mode 2 is used having a fine tuner grid, that means a narrow step width. For high bit rate reception, the carrier recovery loop following the tuner part will have an optimum bandwidth in the range from 15 to 30 kHz for symbol rates higher than 15 Msym/s. This loop is wide enough to suppress the tuner residual FM. The loop is also fast enough to track single fine tuner frequency steps when the receiver is in lock. This allows the compensation of input frequency drift. When the AFC detector 25 in FIG. 1 detects a wide deviation from nominal and a single side cut-off of the signal is near, the tuner may be stepped to compensate.

For high bit rate reception therefore mode 1 is not used. Mode 2 is made slow to allow in-lock steps of the tuner, which are tracked in the carrier recovery loop with an acceptable transition phase error.

The invention further proposes an advantageous extended acquisition algorithm for low rate reception, that is for reception of information signals with a low bandwidth respectively low bit rate.

The algorithm for acquisition of a low rate channel includes the following steps. Operating the synthesizer in mode 2 a frequency sweep around the expected frequency value is started. An optimum lock position will be detected and the divider ratio of this point is stored in a memory. The receiver is brought into lock. A controller calculates the nearest position of the LO using synthesizer mode 1. The synthesizer and therefore the PLL steps towards this position in the fine grid mode 2. The receiver maintains frequency lock during the steps which are tracked by a DTO with a reference numeral 26 in FIG. 1. When the proper frequency position is reached, the divider ratios N and M are switched to mode 1 settings. Phase acquisition will follow since no frequency error is present.

So, briefly, the present invention provides the
  use of only one IF filter, with sufficient bandwidth for the highest bit rate, and the
  use of an ADC with sufficient resolution for low bit rate in combination with the IF filter, wherein this IF filter is designed for a high bit rate.

For a high bit rate, the following operation step is performed:
  Switch the tuner PLL synthesizer to small step width and low loop bandwidth, to enable an accurate tuning including an automatic frequency control via this PLL.

For low bit rate, the following operation steps are performed:
  1. Switch the tuner PLL synthesizer to small stepsize and low loop bandwidth during search-tuning. By making small steps the wanted channel can be found and the (digital) carrier recovery loop can get in lock.
  2. Continue PLL synthesizer tuning in small steps (the digital carrier recovery loop remains in lock) until the nearest frequency position is reached, which fits with the frequency raster for coarse frequency steps (large step width).
  3. Without change of tuner oscillator (LO) frequency, switch the tuner PLL synthesizer to large step width and wide loop bandwidth, to create micropophony robustness. During this change also the loop components of the PLL need to be adapted to create the wider loop bandwidth and the correct damping factor.
  4. Automatic frequency control, which is needed to track the drift of the LNB, is not done by the tuner PLL, but by the digital AFC (de-rotating) circuit in the carrier recovery loop. The narrow bandwidth of the low bit rate QPSK allows a frequency shift of this channel within the much wider IF filter.

Figure 4:
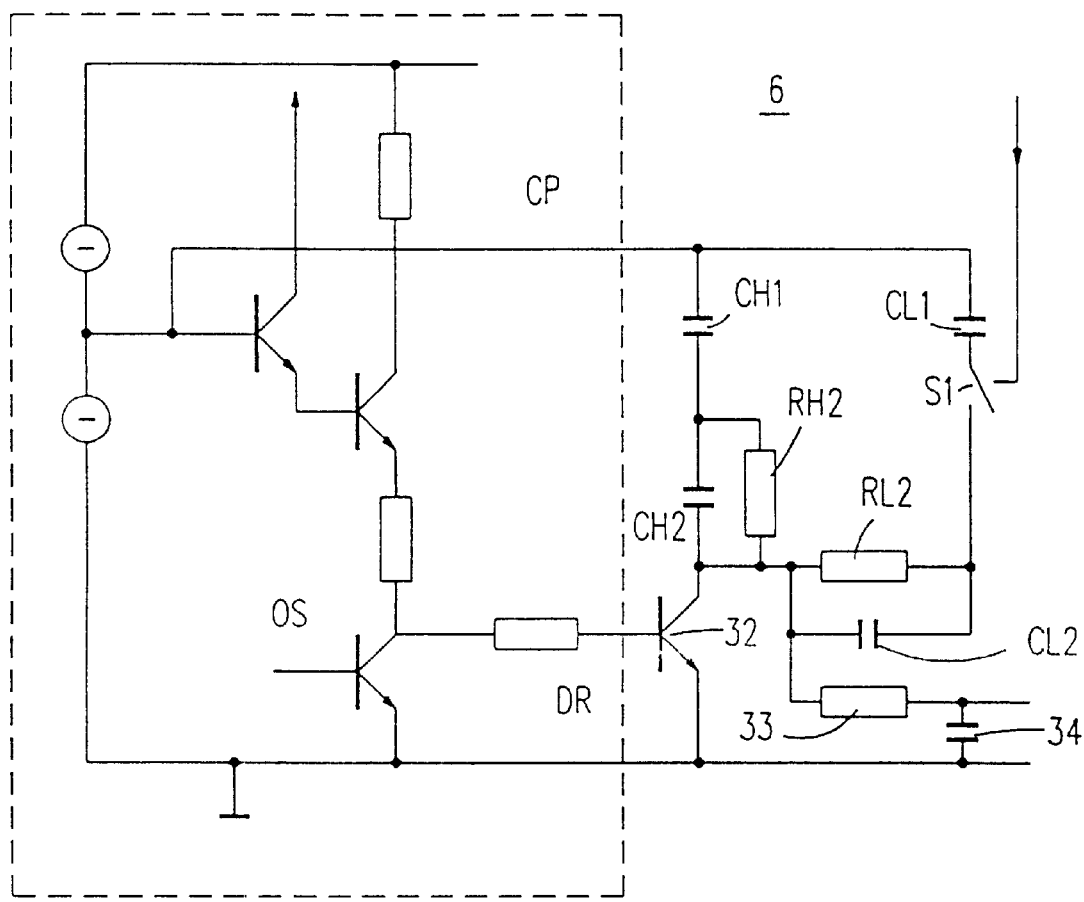
Figure 5:
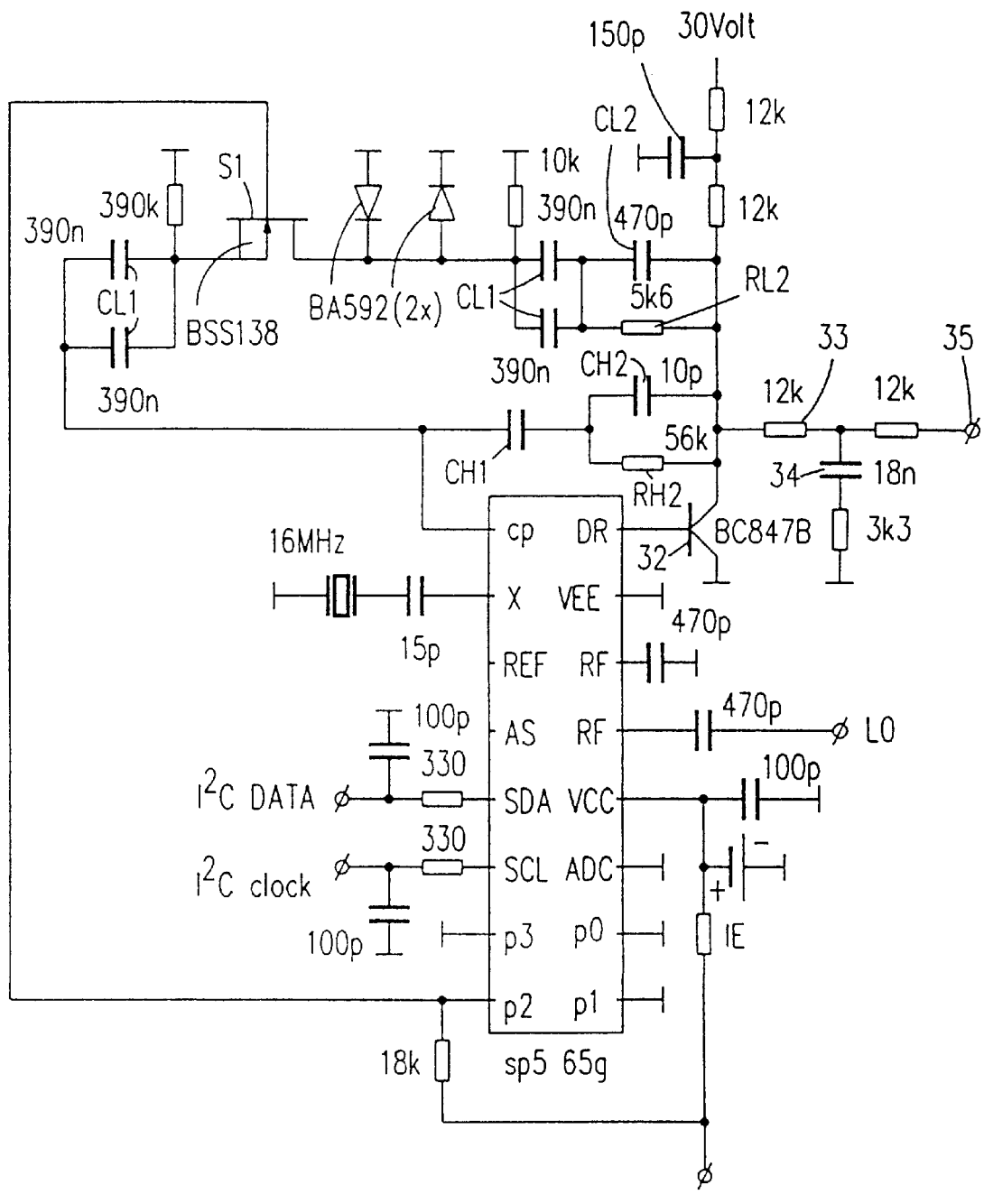
Figure 6A:
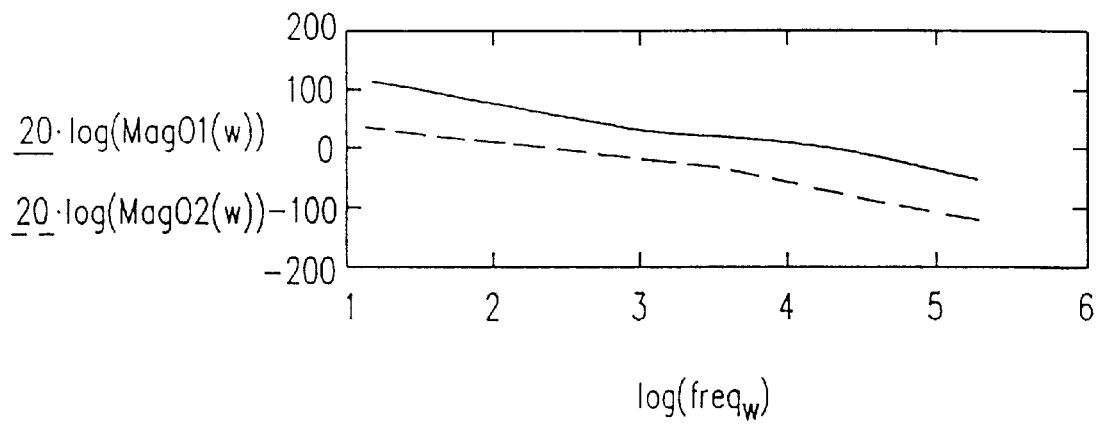
Figure 6B:
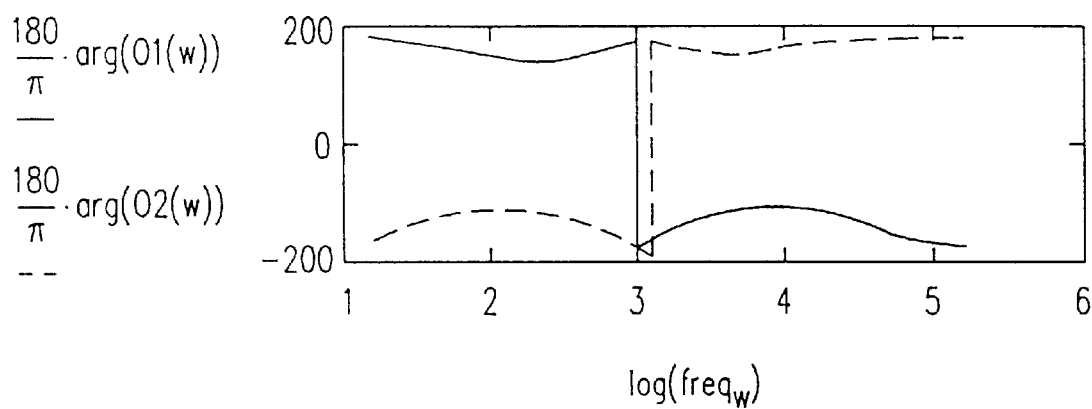

FIG. 1 shows a state of the art receiver concept for variable rate digital signals transmitted via satellite, FIG. 2 shows some examples of receiver input signal options, FIG. 3 shows an example for mode 1 and mode 2 tuner grids, FIG. 4 shows an example for a schematic realisation of a switchable loop filter, FIG. 5 shows an application example of a switchable loop filter, and FIG. 6 shows an example of an open loop frequency transfer function of a loop operating in mode 1 and mode 2.

The receiver already referred to in the aforesaid and shown in FIG. 1 comprises a tracking filter 1 for mirror suppression with an input 30 connected to an LNB (not shown) and an output 31 connected to a first input of a mixer 2. A second input of mixer 2 is connected to a VCO forming an LO 3 of a tuner. By mixing the input signal from the LNB with the LO frequency the input signal is converted to the IF band and afterwards fed into an IF filter 11 of the SAW type with a fixed bandwidth. To achieve tuning, the LO frequency is controlled by a PLL comprising the LO 3, a prescaler 4 operating as a frequency divider having a dividing ratio P that may have a fixed or programmable value, a programmable (frequency) divider 5 having a programmable dividing ratio N, a loop filter 6, a phase detector 7, a (reference) frequency divider 8 having a fixed or programmable dividing ratio M and a crystal oscillator 9 supplying a reference frequency preferably in the range of 4 to 20 MHz. The elements with the reference numerals 3 to 9 together form the tuner PLL and are connected in the way a PLL usually is formed. Prescaler 4 and divider 5 divide the LO frequency to obtain a comparison frequency, and so does the divider 8 with the reference frequency of the crystal oscillator 9. The oscillation signals from dividers 5 and 8 are compared in the phase detector 7, the output of which is filtered by the loop filter 6 and fed to LO 3 as phase and frequency control signal resp. voltage. Another branch of the circuitry leds from loop filter 6 via a DC converter 10 to tracking filter 1 for switching it to an operation mode in which the wanted channel may optimally be received. However, this part of the circuit in FIG. 1 is not affected by the invention and will not be discussed here.

From the IF filter 11 the IF signal is fed to mixer stages 12 and 13 which two stages form a quadrature mixer. This quadrature mixer is fed with two oscillation signals having a phase angle of 90° to each other and being obtained from an analog VCO 14 via a phase shifting stage 17. After passing two stages 15 and 16 not further discussed here and two automatic gain control stages 18 and 19, hereinafter named as AGC, the two output signals—baseband signals I and Q—from the quadrature mixer are converted into digital form by ADC 20 resp. 21 and then fed into a complex multiplier 22, which, together with Nyquist filters 23, 24, AFC detector 25 and DTO 26 forms an AFC loop. The "local phase locked loop", a digital PLL comprising complex multiplier 27, DTO 28 and phase comparator 29, is part of the carrier recovery circuit.

In FIG. 2, an example for a definition of the I and Q baseband signals is given. The selective element in the receiver preceding the stages for demodulating the IF signals into the baseband is the IF (SAW) filter 11. Since the symbol rate can change (and so will the bandwidth of the modulated signal) also adjacent respectively interfering channels can pass through the IF filter. A number of possible situations is shown in FIG. 2. It has to be noted that combinations of the situations shown in FIG. 2 are possible.

Figure 2A:
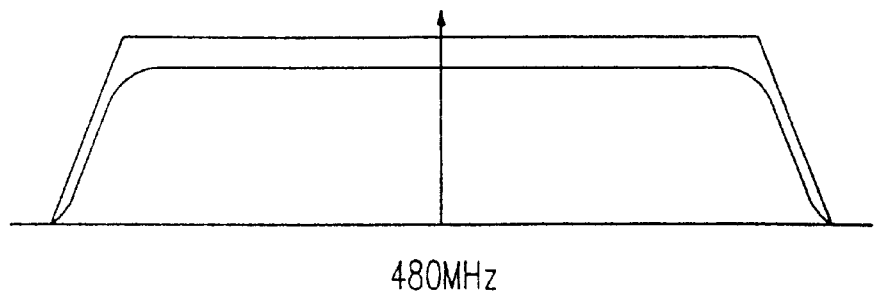

In the case of the single carrier situation shown in FIG. 2a) the QPSK respectively BPSK modulated signal fits within the passband of the IF filter. All adjacent channels are suppressed sufficiently.

Figure 2B:
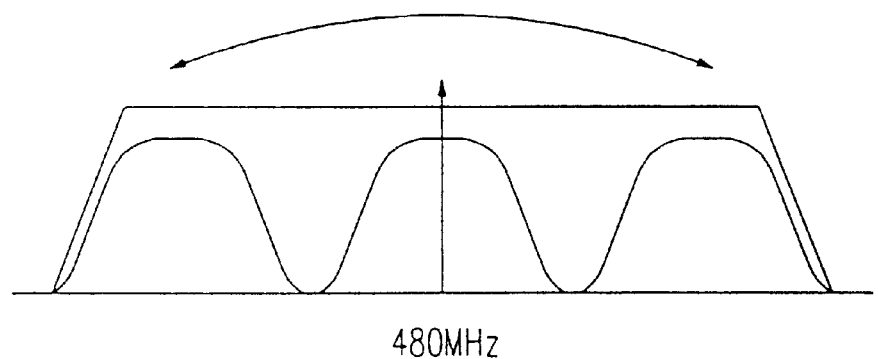

In the multi carrier situation shown in FIG. 2b) together with the wanted modulated signal also some unwanted digital modulated signals are passing the IF filter. After quadrature demodulation these unwanted signals fold back on each other. These unwanted channels will result in the baseband as adjacent channel interferences.

Figure 2C:
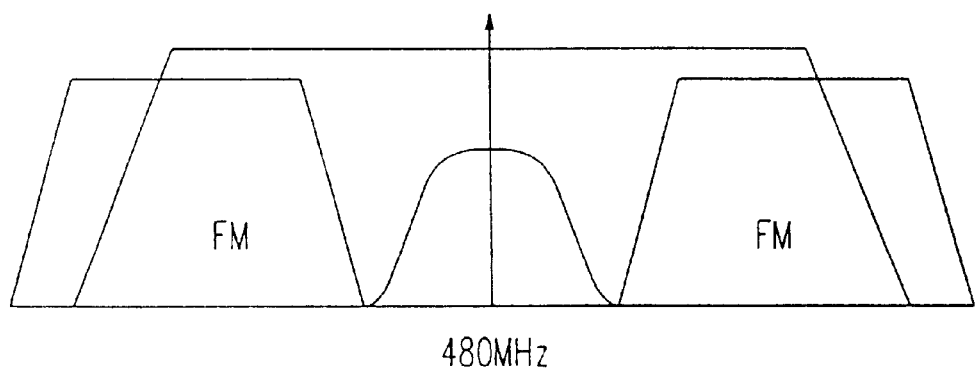

In the so-called simul-cast situation of FIG. 2c) the QPSK respectively BPSK modulated signals have FM modulated signals as adjacent channels. The power of these FM modulated signals is generally higher (10 to 15 dB) than the digital modulated signal. Also in this situation, these FM modulated signals will cause adjacent channel interference.

FIG. 3 shows an example comprising a tuner grid with a step width of 4 MHz in operation mode 1 and of 125 kHz in operation mode 2. This is obtained with comparison frequencies of 2 MHz resp 62.5 kHz and prescaler 4 enabled (that is ratio P>1). The expected input signal has a carrier frequency of 1520.5 MHz. With an IF of 479.5 MHz, the expected LO frequency is at 2 GHz, giving N=16000. A frequency sweep in a sweep range SR of +/−3MHz around this value is started. The optimum lock position is found using N=16008, due to 1 MHz LNB frequency error. The nearest position in the tuner grid having a step width of 4 MHz is at N=500. The tuner is stepped down from N=16008 to N=16007 and further step by step down to 16000. Next the comparison frequency and the divider ratio is switched.

FIG. 4 shows a schematic circuit diagram of a realisation of a loop filter 6 that is built up to be switchable between two bandwidths according to the invention. The elements within the dotted marked box preferably are comprised in an integrated circuit which, in the example shown, may be the already mentioned IC of the type SP5659 of GEC Plessey semiconductors. The standard solution for a loop filter with one fixed bandwidth uses all components of the circuitry shown in FIG. 4 with the exception of the following elements: A capacitor CL1, a further capacitor CL2, a resistor RL2 and a switch S1. So, the solution for a loop filter with a fixed bandwidth built up with the SP5659 provides the elements of the IC which are not described further hereinafter and, outside the IC, two capacitors named CH1 and CH2 resp., connected to each other in series and in series to the collector-emitter-path of a transistor 32. One terminal of the first mentioned capacitor CH1 is connected to a terminal of the IC, this terminal being denoted by CP. Another terminal of said IC denoted as DR is connected to the base terminal of transistor 32, and the emitter terminal of transistor 32 is connected to ground. A resistor RH2 is connected in parallel to capacitor CH2. Elements CH1, CH2 and RH2 form a bandwidth-determining structure of loop filter 6 realized with IC SP5659. A control voltage for controlling the oscillation frequency of a VCO connected to the IC SP5659 is tapped off between the collector terminal and the emitter terminal of transistor 32. This control voltage is fed into the VCO not shown in FIG. 4 via a low pass stage comprising resistor 33 and capacitor 34.

To obtain a switchable bandwidth, the already mentioned elements CL1, CL2, RL2 and S1 are added to the circuitry of FIG. 4 as described up to now. These two capacitors and the resistor form another bandwidth-determining structure of loop filter 6 and therefore are connected to each other in the same way as the elements of the first bandwidth-determining structure mentioned above. Furthermore, this second structure CL1, CL2, RL2 is connected in parallel to the first structure CH1, CH2, RH2. Switch S1 is connected between elements CL1 and CL2 resp. RL2. Such, switch S1 activates the second structure CL1, CL2, RL2 when being in its conducting (closed) state, and it deactivates the second structure when being in its non-conducting (opened) state. This switch can be operated from an output port of the synthesizer.

Loop elements CH1, CH2 and RH2 of the high bandwidth mode are designed according the guidelines as described in the specification of the integrated circuit of the type SP5659—2.7 GHz I2C bus controlled low phase noise frequency synthesizer—and in the publication "AN168 TV/satellite synthesizers—basic design guidelines", both issued by GEC Plessey semiconductors. With switch S1 in the open position, the new additional components CL1, CL2 and RL2 do not influence the high bandwidth loop behaviour.

With switch S1 in the closed position, the impedance of the parallel switched branch CL1, CL2 and RL2 is dominating the loop transfer characteristics. The loop design therefore applies rules from the above mentioned GEC publications and neglects the small influence of CH1, CH2 and RH2.

FIG. 5 shows an application example with switch S1 being realized by an N-channel SIPMOS switch of the type BSS138. Switch S1 can also be realized with analog switches like 4066 type CMOS transistors or the like.

In FIG. 5 the integrated circuit SP5659 is shown schematically, its above-mentioned terminals CP and DR drawn in the top. The LO is connected to one of two 20 terminals denoted as RF via a capacitor that has a capacitance of 470 pF; another terminal RF for feeding the LO frequency is connected to ground via another capacitance of 470 pF. The other terminals of SP5659 shown in FIG. 5 do not have any contribution to the invention and therefore will not be described here.

The elements of the two bandwidth-determining structures CH1, CH2, RH2 and CL1, CL2, RL2, S1 are found in the upper part of FIG. 5 and in principle connected and denoted as already known from FIG. 4. Capacitor CL1 is split up in total into four capacitors of a capacitance of 390 nF each, two and two thereof being connected to each other in parallel, these parallel connections being connected to each other via switch S1. From the connection between switch S1 and the first parallel connection of CL1 drawn on the left a resistor of 390 kOhms leads to ground, from the connection between switch S1 and the other parallel connection of CL1 drawn on the right side of S1 a parallel connection of two switching diodes of the type BA592 (connected to each other in antiparallel) and a resistor of 10 kOhms leads to ground. The low pass stage comprising resistor 33 and capacitor 34 now further comprises another series resistor of the same amount of resistance as resistor 33 and a resistor of 3.3 kOhms in series with capacitor 34. The output of this low pass stage is formed by a terminal 35 that is connected to LO 3 for feeding a control voltage to this LO.

In the embodiment of FIG. 5 the two switching diodes (BA592) form additional parts of the loop components. For fast frequency switching resp. tuning in operation mode 2, the voltage at the collector of transistor 32 must be changed rapidly. During the tuning procedure a transient voltage is created at the drain terminal of the SIPMOS transistor BSS138 forming switch S1. As an example, for switching a voltage of 30 Volts within 100 msec, the required capacitor current for keeping the drain voltage equal to zero will have an amount of about 200 $\mu$A, if a capacitance of 680 nF is assumed to be loaded resp. unloaded during tuning. This value of capacitance results from the capacitances included in the circuitry of the bandwidth-determining structures. The capacitor current can be delivered by the switching diodes (BA592), clamping the transient voltage to a value less than 0.5 V. This allows switching resp. tuning with a relatively short transition time.

Furthermore, another low pass stage is connected between a terminal conducting a supply voltage and the connection point between the two bandwidth-determining structures, transistor 32 and the low pass stage comprising the elements 33, 34. This another low pass stage comprises two resistors of 12 kOhms in series, the connection point of these two resistors being connected to ground via a capacitor of 150 pF. In this embodiment, said supply voltage has a value of 30 V.

Examples for dimensioning the elements of FIG. 4 resp. FIG. 5 are given as follows:

| CL1 | 390 nF | CH1 | 390 pF |
|---|---|---|---|
| CL2 | 470 pF | CH2 | 10 pF |
| RL2 | 5.6 kOhm | RH2 | 56 kOhm |
| Resistor 33 | 12 kOhm | Capacitor 34 | 18 nF |

FIG. 6 shows open loop frequency transfer functions of mode 1 and mode 2. In this figure, part a) shows the magnitude of the open loop frequency transfer function during operation mode 1, denoted as MagO1, plotted with a continuous line to a base of the angular frequency, denoted as w, both in a logarithmic scale. In the same way the magnitude of the open loop frequency transfer function during operation mode 2, denoted as MagO2, is plotted with a dotted line. Part b) of FIG. 6 shows the corresponding phase of the open loop frequency transfer function during mode 1, denoted as (180/$\pi$).arg(O1), plotted with a continuous line to a base of the angular frequency w, both too in a logarithmic scale. In the same way the phase of the open loop frequency transfer function during mode 2, denoted as (180/$\pi$).arg(O2), is plotted with a dotted line.

CONCLUSION

Proposed is a switchable loop filter structure which allows a dual mode operation. A low bandwidth mode is used during acquisition of a channel. In case of high rate reception the low bandwidth synthesizer loop is combined with a high bandwidth carrier recovery loop. This combination allows steps of the synthesizer which are tracked in the carrier recovery loop. The tuner steps are used to compensate input signal frequency drift.

An algorithm is proposed which allows acquisition in a low synthesizer loop bandwidth mode and switching to a high bandwidth synthesizer loop mode while maintaining frequency lock. This allows the use of a high bandwidth synthesizer loop and a low bandwidth carrier recovery loop. This combination is best for reception of low rate input signals. The synthesizer loop compensates for residual FM of the tuner Local Oscillator.

What is claimed is:

1. A satellite receiver for reception of L-band signals, especially of variable rate, quasi phase shift keying (QPSK) modulated digital signals, in the form of at least one modulated carrier modulated with at least one information signal having different possible bandwidths respectively bit rates, comprising a tuning stage in which said L-band signals are mixed down to a fixed intermediate frequency (IF) by means of a tunable local oscillator (LO), the frequency of said LO being locked by a phase locked loop (PLL) to a comparison frequency obtained from a reference frequency source, said PLL comprising at least one programmable frequency dividing means for dividing the frequency of the LO to obtain a frequency comparable with the comparison frequency, said PLL further comprising a loop filter for gaining a control signal fed into said LO for the tuning of said LO, an IF filter stage of a given bandwidth, especially of surface acoustic wave (SAW) type, and a stage for demodulating and/or decoding of said information signals, comprising at least a carrier recovery loop for recovering the carrier frequency of an actually received one of said L-band signals, characterized by said IF filter stage being dimensioned with a fixed bandwidth sufficient for the highest possible bandwidth resp. bit rate of all information signals to be received, said loop filter being formed in such a manner that its bandwidth has a first value when switched to a first operating mode and a second value when switched to a second operating mode, wherein said first value of said bandwidth is larger than said second value of said bandwidth, reference switching means for switching said comparison frequency to a first value during said first operating mode and to a second value during said second operating mode, wherein said first value of said comparison frequency is larger than said second value of said comparison frequency, and control means for automatically tuning said LO to an optimum of reception of respectively one of said L-band signals, these means being arranged in such a manner that they are able to switch said tuning stage between said first and second operating modes.

2. A satellite receiver as claimed in claim 1, wherein said control means is arranged for tuning the LO in frequency steps of a given first stepsize when switched to said first operating mode and of a given second stepsize when switched to said second operating mode, said first stepsize being large compared with said second stepsize, preferably said first stepsize being an integral multiple of said second stepsize.

3. A satellite receiver as claimed in claim 2, characterized in said tuning stage being switched to said second operating mode during search-tuning until said LO is tuned to said optimum of reception, that, if one of said information signals having a large bandwidth respectively bit rate is comprised by the received one (wanted channel) of said L-band signals, said tuning stage is kept in said second operating mode also during signal reception after search-tuning is finished, performing an automatic frequency control by said PLL of said tuning stage, that, if one of said information signals having a narrow bandwidth respectively bit rate is comprised by the received one (wanted channel) of said L-band signals, said tuning stage is kept in said second operating mode during search-tuning, performing tuning frequency steps of said second stepsize until said carrier recovery loop has locked on the reception of said wanted channel, afterwards said tuning stage is kept in said second operating mode performing additional tuning frequency steps of said second stepsize while keeping said carrier recovery loop locked until the frequency of said LO is equal to the next one of said frequency steps of said first operating mode, when reaching said next one of said frequency steps of said first operating mode, said tuner stage is switched into said first operating mode while keeping the actual frequency of said LO constant, thus operating said tuner stage in said first operating mode during reception of said wanted channel, performing an automatic frequency control by said carrier recovery loop.

* * * * *